(12) United States Patent
Ogura et al.

(10) Patent No.: US 9,606,456 B2
(45) Date of Patent: Mar. 28, 2017

(54) LITHOGRAPHY APPARATUS, DETERMINATION METHOD, AND METHOD OF MANUFACTURING ARTICLE

(71) Applicant: CANON KABUSHIKI KAISHA, Tokyo (JP)

(72) Inventors: Masahiro Ogura, Saitama (JP); Kazuhiko Mishima, Utsunomiya (JP); Kazushi Mizumoto, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 5 days.

(21) Appl. No.: 14/714,595

(22) Filed: May 18, 2015

(65) Prior Publication Data

US 2015/0338751 A1    Nov. 26, 2015

(30) Foreign Application Priority Data

May 21, 2014 (JP) ................. 2014-105667

(51) Int. Cl.
   *G03B 27/58* (2006.01)
   *G03F 7/20* (2006.01)
   *G03F 9/00* (2006.01)

(52) U.S. Cl.
   CPC ...... *G03F 7/70725* (2013.01); *G03F 7/70775* (2013.01); *G03F 9/7003* (2013.01); *G03F 9/7049* (2013.01)

(58) Field of Classification Search
   CPC ............. G03F 7/70725; G03F 7/70775; G03F 9/7003; G03F 9/7049
   USPC ........................................................ 355/72
   See application file for complete search history.

(56) References Cited

U.S. PATENT DOCUMENTS

| 7,098,991 | B2 | 8/2006 | Nagasaka et al. |
| 2006/0033916 | A1 | 2/2006 | Sugihara et al. |
| 2010/0134772 | A1 | 6/2010 | Nagasaka et al. |

FOREIGN PATENT DOCUMENTS

| CN | 1650401 A | 8/2005 |
| CN | 1702558 A | 11/2005 |
| CN | 102243441 A | 11/2011 |
| EP | 1783822 A1 | 5/2007 |

(Continued)

OTHER PUBLICATIONS

Extended Search Report issued in European Appln. No. 15001489.2 mailed Feb. 25, 2016.

(Continued)

*Primary Examiner* — Peter B Kim
(74) *Attorney, Agent, or Firm* — Rossi, Kimms & McDowell LLP

(57) ABSTRACT

The present invention provides a lithography apparatus which forms a pattern on a substrate, the apparatus comprising a stage holding the substrate and being movable; a measurement unit configured to irradiate a side surface of the stage with light and measure a position of the stage, a generation unit configured to generate a flow of gas in a space where the stage moves, a detection unit configured to detect respective positions of sample shot regions formed on the substrate, and a control unit configured to determine an order of detecting the sample shot regions by the detection unit such that detection by the detection unit is performed sequentially from a sample shot region closer to the measurement unit with respect to sample shot regions located on a downstream side of the flow of the gas from a center of the substrate.

13 Claims, 5 Drawing Sheets

(56) References Cited

FOREIGN PATENT DOCUMENTS

| JP | 2000260827 A | 9/2000 |
| JP | 2005217092 A | 8/2005 |
| KR | 1020050118309 A | 12/2005 |

OTHER PUBLICATIONS

Office Action issued in Korean Appln. No. 10-2015-0066548, mailed Oct. 19, 2016.
Office Action issued in Chinese Appln. No. 201510257107.9 mailed Jan. 24, 2017. English translation provided.

LITHOGRAPHY APPARATUS, DETERMINATION METHOD, AND METHOD OF MANUFACTURING ARTICLE

BACKGROUND OF THE INVENTION

Field of the Invention

The present invention relates to a lithography apparatus, a determination method, and a method of manufacturing an article.

Description of the Related Art

An exposure apparatus which transfers a mask pattern onto a substrate is one of apparatuses to be used in a manufacturing step (lithography step) of a semiconductor device or the like. In the exposure apparatus, a global alignment method is generally used as a method of alignment between a mask and the substrate. In the global alignment method, alignment is performed by detecting the positions of some representative shot regions (sample shot regions) formed on the substrate and using an index obtained by statistically processing the detection result and used as a common index in all the shot regions on the substrate. Japanese Patent Laid-Open No. 2005-217092 has proposed, for an increase in throughput, a method of determining the detection order of sample shot regions so as to reduce the moving distance of a substrate stage between the end of position detection of the sample shot regions and the start of exposure of the sample shot regions.

In general, the exposure apparatus includes a measurement unit (for example, an interferometer) which irradiates the side surface of the substrate stage with light and measures the position of the substrate stage based on reflected light, and controls the movement of the substrate stage based on a measurement result by the measurement unit. If a temperature distribution occurs on an optical path of light emitted from the measurement unit due to the influence of heat generated as the movement of the substrate stage, an error may occur in the measurement result by the measurement unit. Then, if such an error occurs while detecting the position of each sample shot region, it may become difficult to accurately obtain the common index used in all the shot regions on the substrate.

SUMMARY OF THE INVENTION

The present invention provides, for example, a technique advantageous in terms of performing global alignment.

According to one aspect of the present invention, there is provided a lithography apparatus which forms a pattern on a substrate, the apparatus comprising: a stage holding the substrate and being movable; a measurement unit configured to irradiate a side surface of the stage with light and measure a position of the stage based on light reflected by the side surface; a generation unit configured to generate a flow of gas in a space where the stage moves; a detection unit configured to detect respective positions of a plurality of sample shot regions formed on the substrate; and a control unit configured to determine an order of detecting the sample shot regions by the detection unit such that detection by the detection unit is performed sequentially from a sample shot region closer to the measurement unit with respect to sample shot regions located on a downstream side of the flow of the gas from a center of the substrate.

Further features of the present invention will become apparent from the following description of exemplary embodiments with reference to the attached drawings.

DESCRIPTION OF THE EMBODIMENTS

Figure 1:
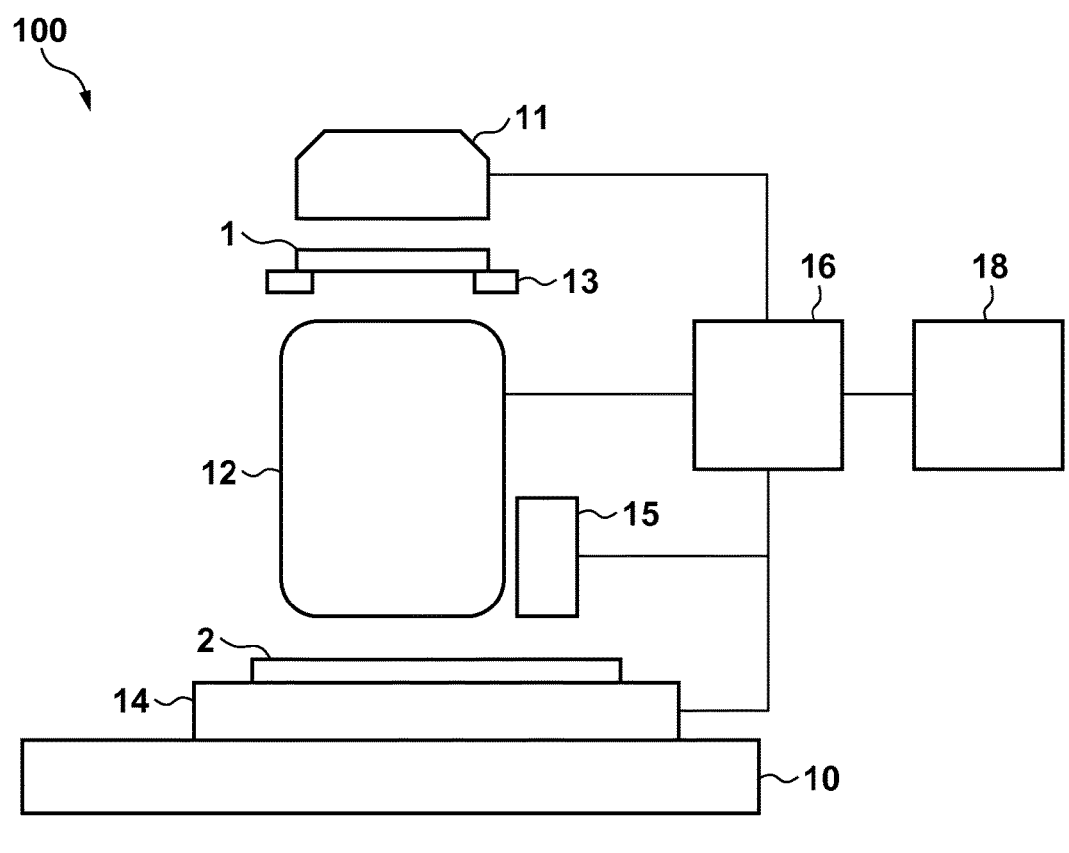
FIG. 1 is a schematic view showing the arrangement of an exposure apparatus according to the first embodiment.

Exemplary embodiments of the present invention will be described below with reference to the accompanying drawings. Note that the same reference numerals denote the same members throughout the drawings, and a repetitive description thereof will not be given. In the following embodiment, an exposure apparatus which transfers a mask pattern onto a substrate will be described. However, the present invention is not limited to this. The present invention can also be applied to, for example, a lithography apparatus such as an imprint apparatus which molds an imprint material on the substrate using a mold or a drawing apparatus which irradiates the substrate with a charged-particle beam and forms a pattern on the substrate.

First Embodiment

An exposure apparatus 100 according to the first embodiment of the present invention will be described with reference to FIG. 1. FIG. 1 is a schematic view showing the arrangement of the exposure apparatus 100 according to the first embodiment. The exposure apparatus 100 can include, for example, an illumination optical system 11, a projection optical system 12, a mask stage 13, a substrate stage 14, a detection unit 15, and a control unit 16. For example, the control unit 16 includes a CPU, a memory, or the like and controls a process of transferring a pattern formed on a mask 1 onto a substrate 2 (a process of exposing the substrate 2).

The illumination optical system 11 illuminates the mask 1 held by the mask stage 13 with light emitted from a light source (not shown). The projection optical system 12 has a predetermined magnification (for example, ×½) and projects the pattern formed on the mask 1 onto the substrate 2. The mask 1 and the substrate 2 are respectively held by the mask stage 13 and the substrate stage 14, and are located optically in almost conjugate positions (the object plane and the image plane of the projection optical system 12) via the projection optical system 12. For example, the mask stage 13 holds the mask 1 by vacuum chuck, electrostatic chuck, or the like and is configured to be movable in, for example, the X and Y directions. For example, the substrate stage 14 holds the substrate 2 by vacuum chuck, electrostatic chuck, or the like and is configured to be movable in, for example, the X and Y directions.

The detection unit 15 detects the positions (including the rotations) of some representative shot regions 2a (a plurality of sample shot regions 2b) formed on the substrate in order to perform alignment between the mask 1 and the substrate 2 using a global alignment method. The detection unit 15 obtains the positions of the respective sample shot regions 2b by, for example, detecting a plurality of marks provided in the sample shot regions 2b. This allows the control unit 16 to obtain a common index used in all the shot regions 2a on the substrate by statistically processing the positions of the respective sample shot regions 2b detected by the detection unit 15. In the first embodiment, the detection unit 15 is provided as an off-axis detection unit which detects the positions of the respective sample shot regions 2b without intervening the projection optical system 12. However, the present invention is not limited to this. The detection unit 15 may be provided as, for example, a TTL (Through The Lens) detection unit which detects the positions of the respective sample shot regions 2b via the projection optical system 12.

Figure 2:
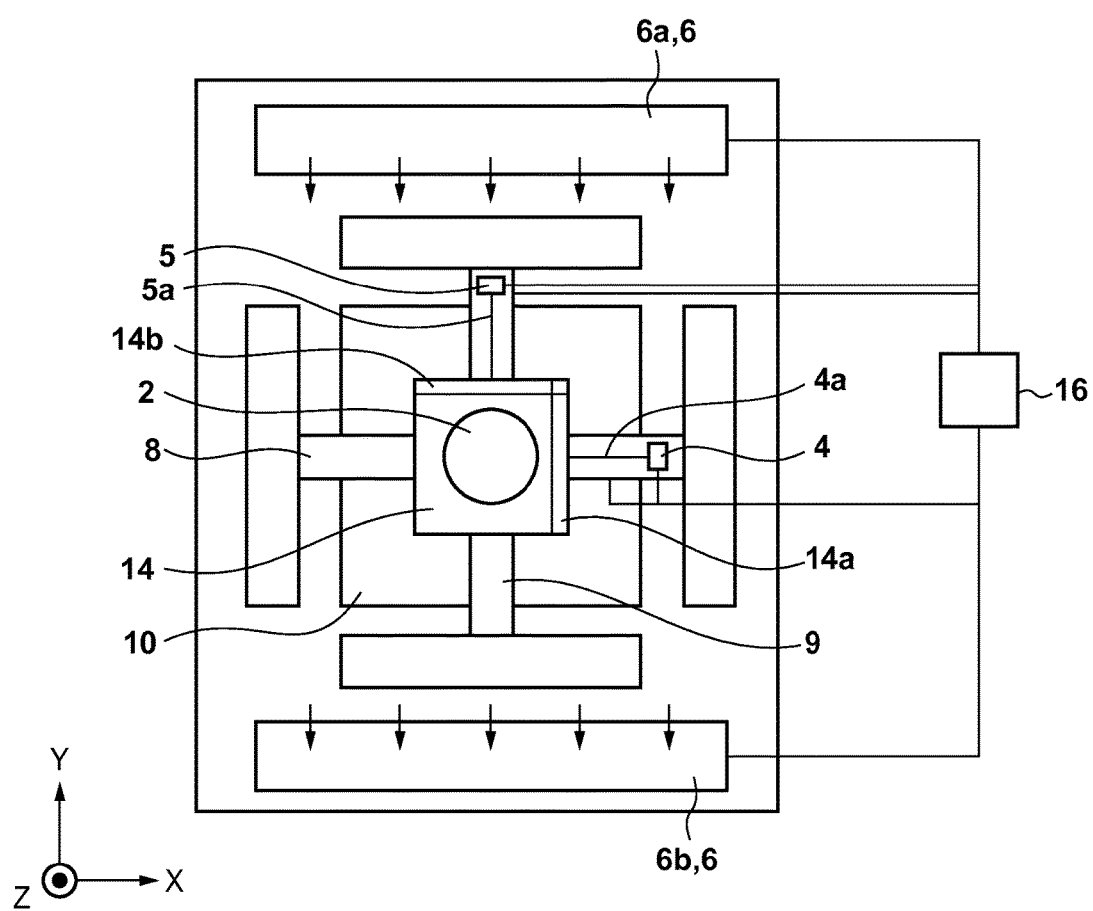
FIG. 2 is a schematic view showing the arrangement of a substrate stage and its peripheral portion.

The arrangement of the substrate stage 14 and its peripheral portion will now be described with reference to FIG. 2. FIG. 2 is a schematic view showing the arrangement of the substrate stage 14 and its peripheral portion. The substrate stage 14 holds the substrate 2 and is configured to be movable on a base member 10 in, for example, the X and Y directions. In the exposure apparatus 100 according to the first embodiment, for example, an X slider 8 and a Y slider 9 configured to drive the substrate stage 14 in the X and Y directions are provided, as shown in FIG. 2. The X slider 8 drives the substrate stage 14 in the X direction on the base member 10. The Y slider 9 drives the substrate stage 14 in the Y direction on the base member 10. By providing the X slider 8 and the Y slider 9 as described above, the substrate stage 14 which holds the substrate 2 can be configured to be movable on the base member 10. The substrate stage 14 may also have a function of, for example, driving the substrate 2 in the Z direction to adjust the height of the substrate 2, rotating the substrate 2 in the θ direction, or correcting the tilt of the substrate 2.

A first measurement unit 4 and a second measurement unit 5 measure the position of the substrate stage 14. The first measurement unit 4 includes, for example, an interferometer, irradiates, with light, the side surface of the substrate stage 14 in the X direction (first direction), and obtains a displacement from the reference position of the substrate stage 14 in the X direction based on light reflected by the side surface. This allows the first measurement unit 4 to measure the position of the substrate stage 14 in the X direction. In an example shown in FIG. 2, the first measurement unit 4 is provided on the X slider 8. However, the first measurement unit 4 can be located in a position where the side surface of the substrate stage 14 in the X direction can be irradiated with light.

Similarly to the first measurement unit 4, the second measurement unit 5 includes, for example, an interferometer, irradiates, with light, the side surface of the substrate stage 14 in the Y direction, and obtains a displacement of the substrate stage 14 in the Y direction based on light reflected by the side surface. This allows the second measurement unit 5 to measure the position of the substrate stage 14 in the Y direction. In the example shown in FIG. 2, the second measurement unit 5 is provided on the Y slider 9. However, the second measurement unit 5 can be located in a position where the side surface of the substrate stage 14 in the Y direction can be irradiated with light. Mirrors 14a and 14b can be provided respectively on the side surface of the substrate stage 14 irradiated with light from the first measurement unit 4 and the side surface of the substrate stage 14 irradiated with light from the second measurement unit 5. By providing the mirrors 14a and 14b on the side surfaces of the substrate stage 14 as described above, the first measurement unit 4 and the second measurement unit 5 can accurately measure the position of the substrate stage 14.

In the exposure apparatus 100, heat can be generated from the X slider 8 or the Y slider 9 which drives the substrate stage 14 as the movement of the substrate stage 14. Then, if heat generated as the movement of the substrate stage 14 is applied to an optical path 4a of light from the first measurement unit 4 and an optical path 5a of light from the second measurement unit 5, and a temperature distribution occurs on each optical path, errors may occur in measurement results by the first measurement unit 4 and the second measurement unit 5. In particular, if such errors occur while detecting the position of each sample shot region, it may become difficult to accurately obtain the common index used in all the shot regions on the substrate. To cope with this, generation units 6 which generate a flow of gas (for example, air) in a space where the substrate stage 14 moves (to be referred to as a moving space hereinafter) are provided in the exposure apparatus 100 in order to keep the moving space at a constant temperature, pressure, humidity, or the like. As shown in FIG. 2, the generation units 6 includes, for example, an ejection unit 6a and a recovery unit 6b located to sandwich the moving space from the ±Y direction. The ejection unit 6a ejects gas in a direction (for example, the −Y direction) crossing the direction of light emitted from the first measurement unit 4. The recovery unit 6b recovers gas emitted from the ejection unit 6a and passing through the moving space. By providing the generation units 6 as described above, it is possible to move, by gas ejected from the ejection unit 6a, heat generated as the movement of the substrate stage 14 in the −Y direction and recover it by the recovery unit 6b.

Figure 3:
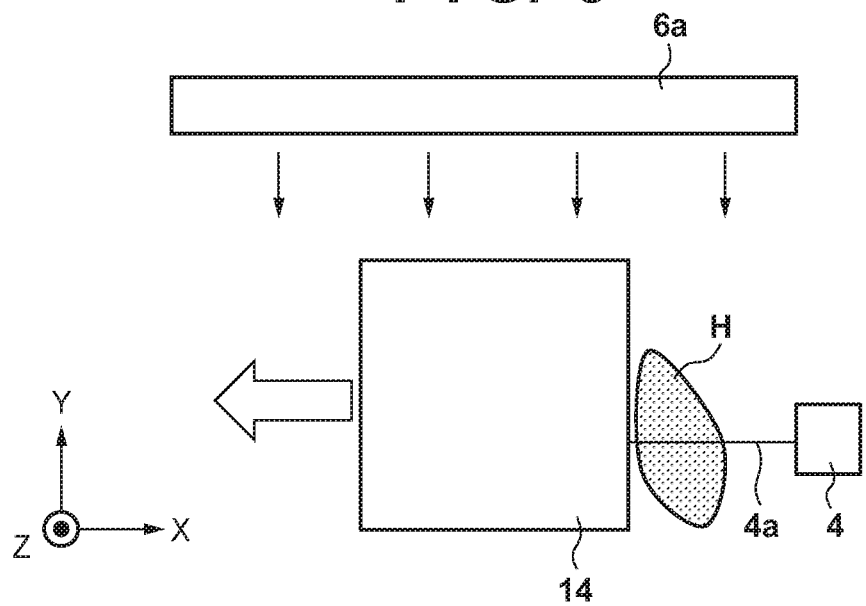
FIG. 3 is a view for explaining heat generated by the movement of the substrate stage.

However, the errors may occur in the measurement results by the first measurement unit 4 and the second measurement unit 5 even if the generation units 6 which generate the flow of gas in the moving space are provided. For example, as shown in FIG. 3, if the substrate stage 14 is moved in a direction (−X direction) away from the first measurement unit 4, a negative pressure is generated in a space after the substrate stage 14 has passed and heat H is accumulated in that space. Then, the heat H accumulated in the space flows in the −Y direction by the flow of gas generated by the generation units 6. At this time, the heat H flowing in the −Y direction by the flow of gas may be applied to the optical path 4a of light from the first measurement unit 4 at a timing for measuring the position of the substrate stage 14 by the first measurement unit 4. As a result, the temperature distribution may occur on the optical path 4a and the error may occur in the measurement result by the first measurement unit 4. Such a measurement error may occur, in particular, when the position of each sample shot region located on the downstream side of the flow of gas from the center of the substrate 2 is measured by moving the substrate stage 14 in the direction away from the first measurement unit 4. This is because the substrate stage 14 is located on the upstream side of the flow of gas in a case in which the position of each sample shot region located on the downstream side is detected as compared with a case in which the position of each sample shot region located on the upstream side of the flow of gas from the center of the substrate 2 is detected.

The exposure apparatus 100 (control unit 16) according to the first embodiment determines the order of detecting the sample shot regions 2b (to be referred to as a detection order hereinafter) by the detection unit 15 so as to reduce the measurement errors caused by heat generated by the movement of the substrate stage 14. For example, the control unit 16 obtains information indicating the location of each sample shot region on the substrate (for example, information indicating the coordinates of each sample shot region) and determines the detection order using that information. In the first embodiment, the direction of the flow of gas in the moving direction, and the positional relationship between the first measurement unit 4 and the substrate stage 14 are considered when determining the detection order as described above. That is, the control unit 16 according to the first embodiment determines the detection order so as to satisfy condition 1 below. Note that the control unit 16 may determine the detection order so as to satisfy condition 1 in all the sample shot regions 2b located on the downstream side of the flow of gas from the center of the substrate 2. This makes it possible to reduce error occurrence in the measurement result of the first measurement unit 4 by the influence of the heat H in the movement of the substrate stage 14 and accurately obtain the common index used in all the shot regions 2a on the substrate.

(Condition 1) The sample shot region closer to the first measurement unit 4 first undergoes detection by the detection unit 15 in the sample shot regions 2b located on the downstream side of the flow of gas from the center of the substrate 2.

Figure 4:
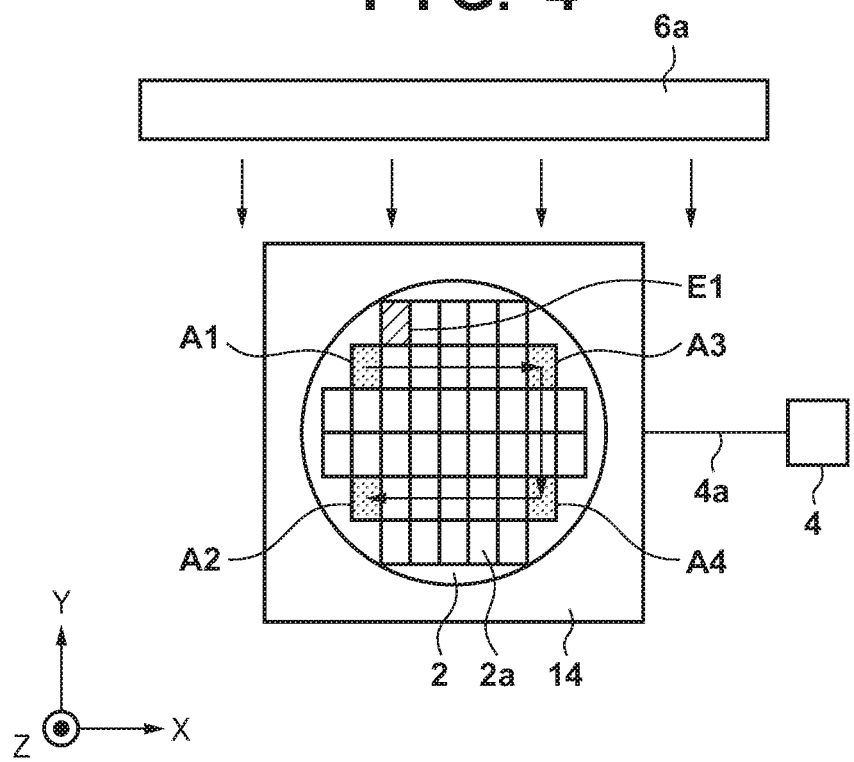
FIG. 4 is a schematic view showing the arrangement of the substrate stage which holds a substrate and its peripheral portion.

For example, as shown in FIG. 4, assume a case in which the four sample shot regions 2b (A1 to A4) are formed on the substrate. In this case, the control unit 16 determines the detection order (A4→A2) such that the sample shot region closer to the first measurement unit 4 first undergoes detection by the detection unit 15 in the two sample shot regions A2 and A4 located on the downstream side of the flow of gas from the center of the substrate 2. Accordingly, the substrate stage 14 is moved in a direction (+X direction) closer to the first measurement unit 4 between detection of the position of the sample shot region A4 and detection of the position of the sample shot region A2. In this case, the heat H generated in the movement of the substrate stage 14 is accumulated in the −X direction of the substrate stage 14. It is therefore possible to suppress application of the heat H to the optical path 4a of the first measurement unit 4 and error occurrence in the measurement result by the first measurement unit 4.

The control unit 16 may determine the detection order so as to increase throughput in addition to determining the detection order in consideration of the flow of gas in the moving space and the position of the first measurement unit 4. That is, in addition to satisfying condition 1 described above, the control unit 16 may determine the detection order so as to satisfy a condition that a detection time required to cause the detection unit 15 to detect the position of each sample shot region is made shorter than a preset allowed time. In addition to satisfying condition 1 described above, the control unit 16 may determine the detection order, for example, so as to satisfy a condition that a moving distance of the substrate stage 14 to cause the detection unit 15 to detect the position of each sample shot region is made smaller than a preset allowable value. At this time, the control unit 16 may determine the detection order such that at least one of the detection time and the moving distance becomes the shortest.

Also, the control unit 16 may determine, after satisfying condition 1 described above, the sample shot region which first undergoes detection by the detection unit 15 in consideration of the position of the substrate stage 14 when the substrate 2 is conveyed onto the substrate stage by a conveying unit 17. That is, the control unit 16 may determine, after satisfying condition 1, the detection order such that the moving amount of the substrate stage 14 between conveyance of the substrate 2 onto the substrate stage by the conveying unit 17 and the start of detection by the detection unit 15 becomes the smallest. Furthermore, the control unit 16 may determine, after satisfying condition 1 described above, the sample shot region which finally undergoes detection by the detection unit 15 in consideration of the position of the shot region (shot region E1) where a pattern is formed first. That is, the control unit may determine, after satisfying condition 1, the detection order such that the moving amount of the substrate stage 14 between the end of detection of the position of each sample shot region by the detection unit 15 and the start of pattern formation in the shot regions 2a becomes the smallest. By determining the detection order as described above, for example, in an example in FIG. 4, the control unit 16 can determine the detection order (A1→A3→A4→A2) as indicated by arrows in FIG. 4.

Figure 5:
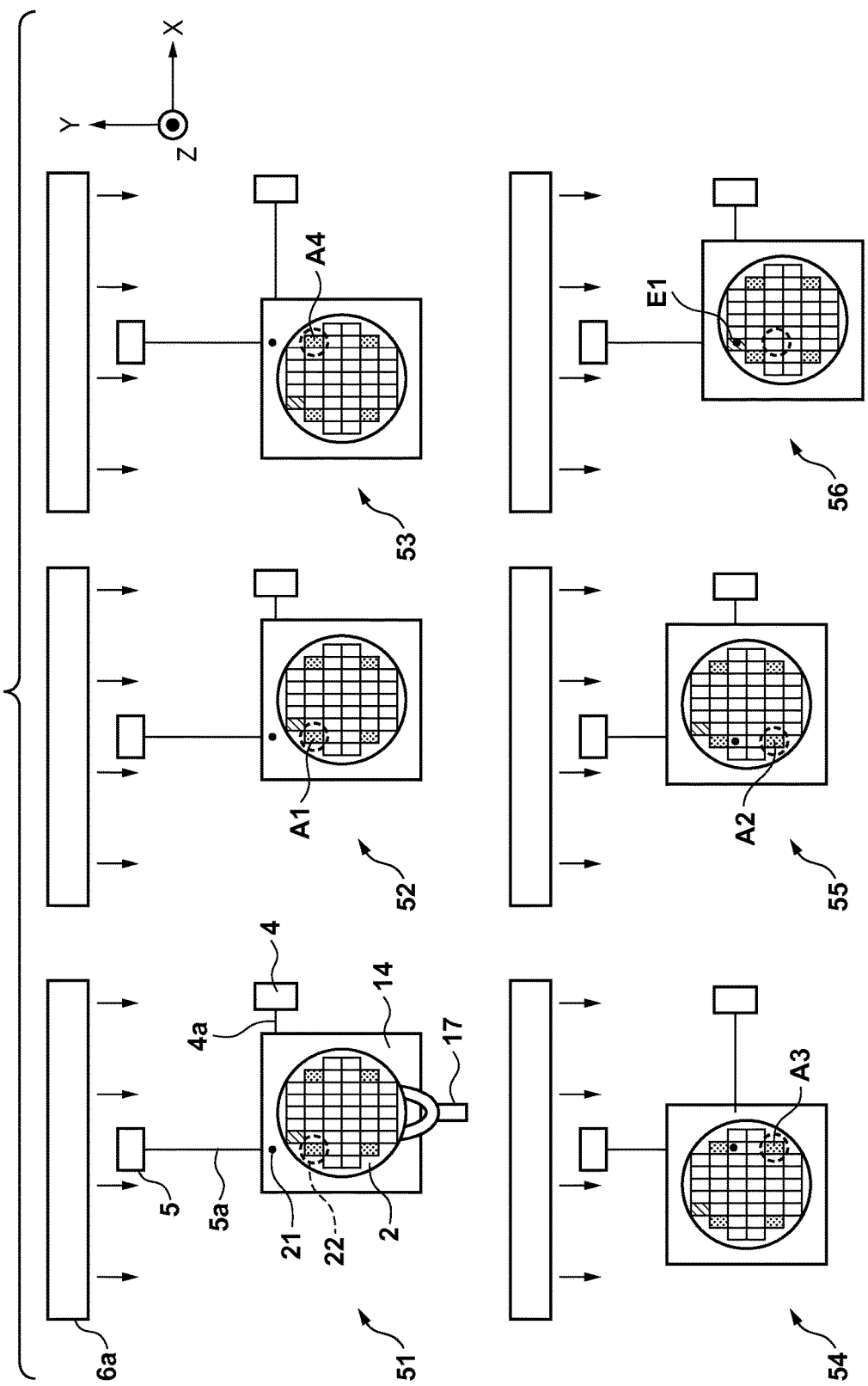
FIG. 5 shows views for explaining the positional relationship between the first measurement unit and the substrate stage.

The positional relationship between the first measurement unit 4 and the substrate stage 14 when detection by the detection unit 15 is performed in the order indicated by the arrows in FIG. 4 will now be described with reference to FIG. 5. In FIG. 5, a position 21 indicates a position on the substrate where exposure is performed (pattern formation is performed) and a position 22 indicates a position on the substrate where detection by the detection unit 15 is performed. First, the control unit 16 causes the conveying unit 17 to convey the substrate 2 onto the substrate stage 14, as shown in 51 of FIG. 5. In the first embodiment, the position 22 where detection by the detection unit 15 is performed becomes closest to the sample shot region A1 when the conveying unit 17 conveys the substrate 2 onto the substrate stage 14. Therefore, the control unit 16 determines the detection order such that the sample shot region which first undergoes detection by the detection unit 15 becomes the sample shot region A1. After the substrate 2 is conveyed onto the substrate stage 14, the control unit 16 controls, as shown in 52 of FIG. 5, the substrate stage 14 to locate the sample shot region A1 in the position 22 and causes the detection unit 15 to detect the position of the sample shot region A1. Then, the control unit 16 controls, as shown in 53 of FIG. 5, the substrate stage 14 to locate the sample shot region A4 in the position 22 and causes the detection unit 15 to detect the position of the sample shot region A4. When detecting the position of each sample shot region located on the upstream side of the flow of gas from the center of the substrate 2 as described above, the substrate stage 14 may be moved in the direction (−X direction) away from the first measurement unit 4. This is because the substrate stage 14 is located on the downstream side of the flow of gas in the case in which the position of each sample shot region on the upstream side is detected as compared with the case in which the position of each sample shot region on the downstream side is detected. It is therefore possible to recover the heat H caused by the movement of the substrate stage 14 so as to avoid application of the heat H to the optical path 4a of the first measurement unit 4 even if the substrate stage 14 moves in the direction away from the first measurement unit 4 when detecting the position of each sample shot region on the upstream side. As a result, the error can become hard to occur in the measurement result by the first measurement unit 4.

After the sample shot region A4 is detected, the control unit 16 controls, as shown in 54 of FIG. 5, the substrate stage 14 to locate the sample shot region A3 in the position 22 and causes the detection unit 15 to detect the position of the sample shot region A3. Then, the control unit 16 controls, as shown in 55 of FIG. 5, the substrate stage 14 to locate the sample shot region A2 in the position 22 and causes the detection unit 15 to detect the position of the sample shot region A2. When detecting the position of each sample shot region located on the downstream side of the flow of gas from the center of the substrate as described above, the substrate stage is moved in the direction (+X direction) closer to the first measurement unit 4. This makes it possible to generate the heat H caused by the movement of the substrate stage 14 in the −X direction of the substrate stage 14 (the opposite side of the first measurement unit). It is therefore possible to make it hard to apply the heat H caused by the movement of the substrate stage 14 to the optical path 4a of the first measurement unit 4 and cause the error in the measurement result by the first measurement unit 4 even when detecting the position of each sample shot region on the downstream side. After the position of the sample shot region A2 is detected, the control unit 16 controls the substrate stage 14 to locate the shot region E1 where pattern formation is performed first in the position 21, as shown in 56 of FIG. 5.

In the exposure apparatus 100, a user may want to emphasize, for example, overlay accuracy or throughput (productivity) when forming the pattern on the substrate 2. It is therefore desirable that the user can select, for example, to emphasize overlay accuracy or throughput when determining the detection order of detecting the position of each sample shot region by the detection unit 15 as well. Therefore, in the exposure apparatus 100 according to the first embodiment, a console unit 18 used by the user to give instructions to the control unit 16 is provided, as shown in FIG. 1. This allows the user to select, according to a use, a mode among a plurality of modes for determining the detection order. Then, the control unit 16 determines the detection order in accordance with the mode selected by the user. The plurality of modes can include, for example, the mode (first mode) in which overlay accuracy is emphasized and the mode (second mode) in which throughput is emphasized. In the first mode, the detection order is determined such that the sample shot region closer to the first measurement unit 4 first undergoes detection by the detection unit 15 in the sample shot regions 2b on the downstream side and the common index used in the plurality of shot regions 2a can be obtained accurately. On the other hand, in the second mode, the detection order is determined such that the detection time required to cause the detection unit 15 to detect the position of each sample shot region becomes shorter (for example, the shortest) than the allowed time. As compared with the first mode, it is impossible to obtain the index accurately but it is possible to reduce the detection time (increase throughput) in the second mode.

Figure 6:
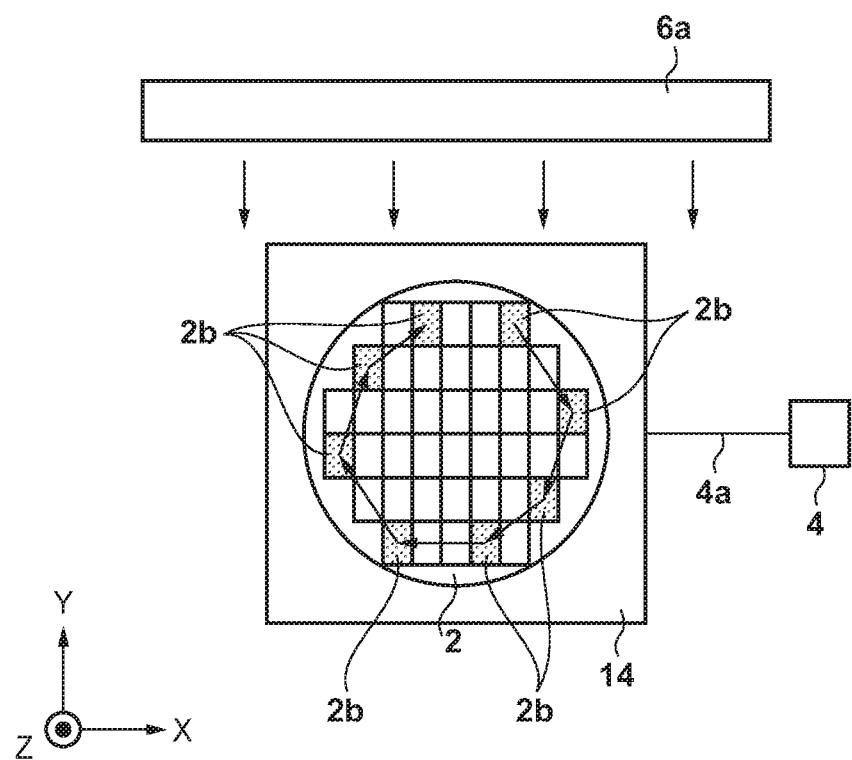
FIG. 6 is a schematic view showing the arrangement of the substrate stage which holds the substrate and its peripheral portion.

As described above, the exposure apparatus 100 according to the first embodiment determines the detection order such that the sample shot region closer to the first measurement unit 4 first undergoes detection by the detection unit 15 in the sample shot regions on the downstream side. As a result, it is possible to make it hard to cause the error by application of the heat H caused by the movement of the substrate stage 14 to the optical path of the first measurement unit 4, and thus to accurately obtain the common index used in the plurality of shot regions 2a. In the first embodiment, as shown in FIG. 4, the example in which the four sample shot regions 2b are formed on the substrate has been described. However, as shown, for example, in FIG. 6, the plurality of sample shot regions 2b may be formed annularly on the substrate. Also in this case, by determining the detection order as indicated by arrows in FIG. 6 in accordance with the above-described condition, it is possible to make it hard to apply the heat H caused by the movement of the substrate stage 14 to the optical path 4a of the first measurement unit 4 and cause the error in the measurement result by the first measurement unit 4.

<Embodiment of Method of Manufacturing Article>

A method of manufacturing an article according to an embodiment of the present invention is suitable for manufacturing an article, for example, a microdevice such as a semiconductor device or an element having a microstructure. The method of manufacturing the article according to this embodiment includes a step of forming a pattern of on a substrate (a step of exposing the substrate) using the above-described lithography apparatus (exposure apparatus), and a step of processing the substrate onto which the pattern has been formed in the preceding step. This manufacturing method further includes other known steps (oxidation, deposition, vapor deposition, doping, planarization, etching, resist peeling, dicing, bonding, packaging, and the like). The method of manufacturing the article according to this embodiment is advantageous in at least one of the performance, the quality, the productivity, and the production cost of the article, as compared with a conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-105667 filed May 21, 2014, which is hereby incorporated by reference herein in its entirety.

What is claimed is:

1. A lithography apparatus which forms a pattern on a substrate, the apparatus comprising:
a stage holding the substrate and being movable;
a measurement unit configured to measure a position of the stage;
a generation unit configured to generate a flow of gas in a space where the stage moves;
a detection unit configured to detect respective positions of a plurality of sample shot regions formed on the substrate; and
a control unit configured to determine an order of detecting the sample shot regions by the detection unit such that, among sample shot regions located on a downstream side of the flow of the gas from a center of the substrate, detection by the detection unit is performed sequentially starting from a sample shot region closest to the measurement unit.

2. The apparatus according to claim 1, wherein the control unit obtains information indicating a location of each sample shot region on the substrate and determines the order using the information.

3. The apparatus according to claim 1, wherein the control unit obtains information indicating coordinates of each sample shot region on the substrate and determines the order using the information.

4. The apparatus according to claim 1, wherein the generation unit includes an ejection unit configured to eject the gas so as to generate, in the space, the flow of the gas in a direction crossing a direction of light emitted from the measurement unit.

5. The apparatus according to claim 1, wherein the control unit determines the order so as to satisfy a condition that detection by the detection unit is performed sequentially from the sample shot region closer to the measurement unit with respect to the sample shot regions located on the downstream side of the flow of the gas from the center of the substrate and a condition that a time period required to cause the detection unit to detect the respective positions of the plurality of sample shot regions is made shorter than an allowed time.

6. The apparatus according to claim 1, wherein the control unit determines the order so as to satisfy a condition that detection by the detection unit is performed sequentially from the sample shot region closer to the measurement unit with respect to the sample shot regions located on the downstream side of the flow of the gas from the center of the substrate and a condition that a distance for moving the stage to cause the detection unit to detect the respective positions of the plurality of sample shot regions is made smaller than an allowable value.

7. The apparatus according to claim 1, wherein the substrate includes a plurality of shot regions each on which the pattern should be formed, and
   the control unit determines the order so as to satisfy a condition that detection by the detection unit is performed sequentially from the sample shot region closer to the measurement unit with respect to the sample shot regions located on the downstream side of the flow of the gas from the center of the substrate, and make a moving amount of the stage between an end of detection by the detection unit and a start of formation of the pattern in each shot region the smallest.

8. The apparatus according to claim 1, further comprising a conveying unit configured to convey the substrate onto the stage,
   wherein the control unit determines the order so as to satisfy a condition that detection by the detection unit is performed sequentially from the sample shot region closer to the measurement unit with respect to the sample shot regions located on the downstream side of the flow of the gas from the center of the substrate, and make a moving amount of the stage between an end of conveyance of the substrate onto the stage by the conveying unit and a start of detection by the detection unit the smallest.

9. The apparatus according to claim 1, wherein the measurement unit is configured to irradiate the stage with light and measure the position of the stage based on light reflected by the stage.

10. The apparatus according to claim 1, wherein the measurement unit includes an interferometer.

11. A lithography apparatus which forms a pattern on a substrate, the apparatus comprising:
    a stage holding the substrate and being movable;
    a measurement unit configured to measure a position of the stage;
    a generation unit configured to generate a flow of gas in a space where the stage moves;
    a detection unit configured to detect respective positions of a plurality of sample shot regions formed on the substrate; and
    a control unit configured to determine an order of detecting the sample shot regions by the detection unit in accordance with a mode selected among a plurality of modes,
    wherein the plurality of modes include a first mode in which the order is determined such that detection by the detection unit is performed sequentially from a sample shot region closer to the measurement unit with respect to sample shot regions located on a downstream side of the flow of the gas from a center of the substrate, and a second mode in which the order is determined such that a time period required to cause the detection unit to detect the respective positions of the plurality of sample shot regions becomes shorter than an allowed time.

12. A method of manufacturing an article, the method comprising steps of:
    forming a pattern on a substrate using a lithography apparatus; and
    processing the substrate, on which the pattern has been formed, to manufacture the article,
    wherein the lithography apparatus forms the pattern on the substrate, and includes:
    a stage holding the substrate and being movable;
    a measurement unit configured to measure a position of the stage;
    a generation unit configured to generate a flow of gas in a space where the stage moves;
    a detection unit configured to detect respective positions of a plurality of sample shot regions formed on the substrate; and
    a control unit configured to determine an order of detecting the sample shot regions by the detection unit such that, among sample shot regions located on a downstream side of the flow of the gas from a center of the substrate, detection by the detection unit is performed sequentially starting from a sample shot region closest to the measurement unit.

13. A determination method of determining, in a lithography apparatus which forms a pattern on a substrate and includes a stage holding a substrate and being movable, a measurement unit configured to measure a position of the stage, a generation unit configured to generate a flow of gas in a space where the stage moves, and a detection unit configured to detect respective positions of a plurality of sample shot regions formed on the substrate, an order of detecting the sample shot regions by the detection unit, the method comprising:
    determining the order such that, among sample shot regions located on a downstream side of the flow of the gas from a center of the substrate, detection by the detection unit is performed sequentially starting from a sample shot region closest to the measurement unit.

* * * * *